(12) United States Patent
Hara

(10) Patent No.: US 12,334,409 B2
(45) Date of Patent: Jun. 17, 2025

(54) SEMICONDUCTOR MODULE

(71) Applicant: FUJI ELECTRIC CO., LTD., Kanagawa (JP)

(72) Inventor: Yasufumi Hara, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 267 days.

(21) Appl. No.: 17/700,532

(22) Filed: Mar. 22, 2022

(65) Prior Publication Data

US 2022/0375810 A1    Nov. 24, 2022

(30) Foreign Application Priority Data

May 21, 2021 (JP) .................................. 2021-085779

(51) Int. Cl.
| | |
|---|---|
| *H01L 23/48* | (2006.01) |
| *H01L 23/00* | (2006.01) |
| *H01L 23/053* | (2006.01) |
| *H01L 23/31* | (2006.01) |
| *H01L 23/34* | (2006.01) |
| *H01L 23/473* | (2006.01) |

(52) U.S. Cl.
CPC ........ *H01L 23/3171* (2013.01); *H01L 23/053* (2013.01); *H01L 23/3121* (2013.01); *H01L 23/34* (2013.01); *H01L 23/473* (2013.01); *H01L 24/32* (2013.01); *H01L 24/40* (2013.01); *H01L 24/73* (2013.01); *H01L 2224/32225* (2013.01); *H01L 2224/40225* (2013.01); *H01L 2224/73263* (2013.01); *H01L 2924/13055* (2013.01); *H01L 2924/351* (2013.01)

(58) Field of Classification Search
CPC ....... H01L 23/32; H01L 23/473; H01L 23/34; H01L 23/053; H01L 23/3121; H01L 24/32; H01L 24/73; H01L 24/40
See application file for complete search history.

(56) References Cited

U.S. PATENT DOCUMENTS

| | | | |
|---|---|---|---|
| 11,094,638 | B2 | 8/2021 | Yamada |
| 2006/0220180 | A1 | 10/2006 | Takahashi |
| 2007/0114577 | A1 | 5/2007 | Narazaki |

(Continued)

FOREIGN PATENT DOCUMENTS

| | | |
|---|---|---|
| JP | 2006245182 A | 9/2006 |
| JP | 2007142138 A | 6/2007 |

(Continued)

OTHER PUBLICATIONS

Office Action issued for counterpart Japanese Application No. 2021-085779, transmitted from the Japanese Patent Office on Jan. 21, 2025 (drafted on Jan. 14, 2025).

*Primary Examiner* — Hoa B Trinh

(57) ABSTRACT

Provided is a semiconductor module, including: a semiconductor chip including a semiconductor substrate and a metal electrode provided above the semiconductor substrate; a protective film provided above the metal electrode; a plated layer provided above the metal electrode, having at least a part being in a height identical to the protective film; a solder layer provided above the plated layer; and a lead frame provided above the solder layer, wherein the plated layer is provided in a range not in contact with the protective film.

21 Claims, 16 Drawing Sheets

(56) References Cited

U.S. PATENT DOCUMENTS

| | | | |
|---|---|---|---|
| 2007/0197017 A1* | 8/2007 | Fujimoto | H01L 24/37 |
| | | | 257/E23.044 |
| 2015/0287666 A1 | 10/2015 | Groenhuis | |
| 2017/0213777 A1* | 7/2017 | Soyano | H01L 23/48 |
| 2018/0190605 A1 | 7/2018 | Hamaguchi | |
| 2020/0365538 A1 | 11/2020 | Hozumi | |
| 2021/0272890 A1* | 9/2021 | Nakano | H01L 24/45 |
| 2021/0305215 A1* | 9/2021 | Sato | H01L 24/48 |

FOREIGN PATENT DOCUMENTS

| | | |
|---|---|---|
| JP | 2015015395 A | 1/2015 |
| JP | 2019186510 A | 10/2019 |
| JP | 2020188095 A | 11/2020 |
| WO | 2017103978 A1 | 6/2017 |
| WO | 2019244492 A1 | 12/2019 |

* cited by examiner

SEMICONDUCTOR MODULE

The contents of the following Japanese patent application are incorporated herein by reference:
NO. 2021-085779 filed in JP on May 21, 2021.

BACKGROUND

1. Technical Field

The present invention relates to a semiconductor module.

2. Related Art

Conventionally, a semiconductor module loaded with a semiconductor chip such as an Insulated Gate Bipolar Transistor (IGBT) is known.
In such a semiconductor module, a wiring member such as a lead frame and the semiconductor chip are bonded via a bonding material such as solder (for example, refer to Patent Documents 1-3).
Patent Document 1: Official Publication No. 2006-245182
Patent Document 2: International Publication WO 2019-244492
Patent Document 3: Official Publication No. 2019-186510

DESCRIPTION OF EXEMPLARY EMBODIMENTS

Figure 1:
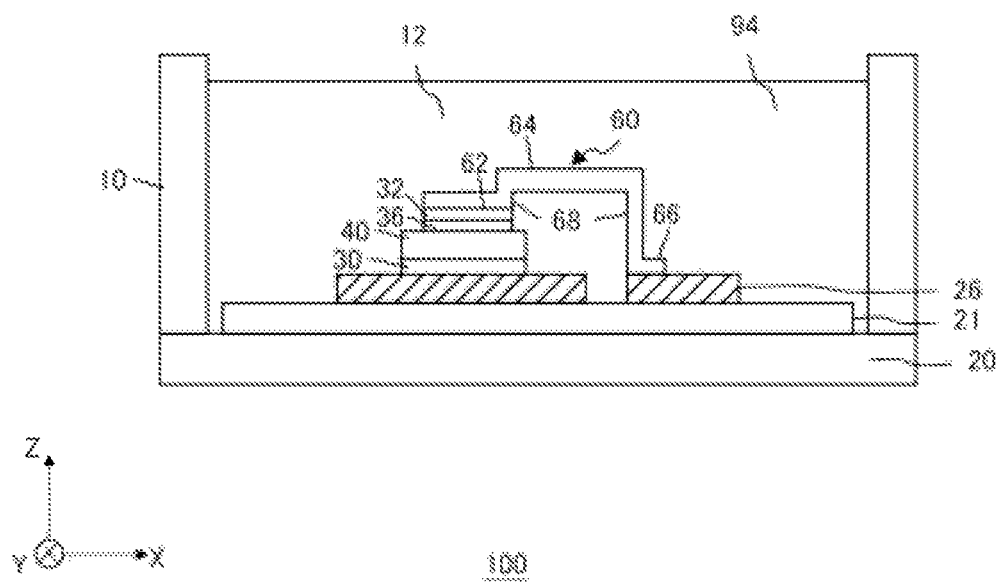
FIG. 1 illustrates one example of a semiconductor module 100 according to one embodiment of the present invention.

Hereinafter, (some) embodiment(s) of the present invention will be described. The embodiment(s) do(es) not limit the invention according to the claims. And all the combinations of the features described in the embodiment(s) are not necessarily essential to means provided by aspects of the invention. Note that, in the present specification and the drawings, a repeated description for an element having a substantially same function and configuration is omitted by providing a same reference numeral, and illustration of an element which is not directly associated with the present invention is omitted. Also, in one drawing, for elements with an identical function and configuration, only a representative sign may be attached and the others may be omitted.

In this specification, one side in a direction parallel to the depth direction of a semiconductor chip is referred to as an "upper" side, and the other side is referred to as a "lower" side. One surface of two main surfaces of a substrate, a layer or other member is referred to as an upper surface, and the other surface is referred to as a lower surface. An "upper" and "lower" direction is not limited to a direction of gravity, or a direction at the time in which the semiconductor module is implemented.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis. In the present specification, orthogonal axes parallel to the upper surface and the lower surface of the semiconductor substrate are referred to as an X axis and a Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

In the present specification, a case where a term such as "identical" or "equal" is mentioned may include a case where an error due to a variation in manufacturing or the like is included. The error is, for example, within 10%.

FIG. 1 illustrates one example of a semiconductor module 100 according to one embodiment of the present invention. The semiconductor module 100 may function as a power conversion apparatus such as an inverter. The semiconductor module 100 includes one or more insulating substrates 21. A predetermined circuit pattern 26 is provided on one surface of the insulating substrate 21, and a cooling portion 20 is provided on the other surface of the insulating substrate 21. The circuit pattern 26 may be configured by bonding a copper or aluminum plate, or a plate plated with these materials, directly to an insulating substrate 21 such as silicon nitride ceramics or aluminum nitride ceramics, or by bonding them through a brazing layer.

One or more semiconductor chips 40 are mounted on the circuit pattern 26. In the example in FIG. 1, one semiconductor chip 40 is mounted. A solder layer 30 bonds the semiconductor chip 40 onto the circuit pattern 26. The solder layer 30 may be the same material as the solder layer 32 described below. The semiconductor chip 40 is protected by a resin package such as a resin case 10 enclosing the insulating substrate 21 and sealing resin 12 filled in the resin case 10. Note that the semiconductor chip 40 or the like may also be protected by transfer molding and so on with the sealing resin 12 without providing the resin case 10.

The semiconductor chip 40 may include a diode such as an IGBT and a Free Wheel Diode (FWD) and so on, and a Revers Conducting (RC)-IGBT that combines these diodes and a MOS transistor and so on.

The semiconductor chip 40 of this example is a vertical-type chip with metal electrodes (for example, an emitter electrode and a collector electrode) formed on the upper surface and the lower surface. The semiconductor chip 40 is connected to the circuit pattern 26 by the metal electrode formed on the lower surface, and connected to the wiring member (the lead frame 60 in this example) by the metal electrode formed on the upper surface. Note that the semiconductor chip 40 is not limited to a vertical-type chip. The semiconductor chip 40 may include a metal electrode connected to the circuit pattern 26 by a wire or the like on the upper surface.

In this example, a plated layer 36 is provided above the metal electrode of the semiconductor chip 40. The metal electrode is connected to the wiring member via the plated layer 36. The plated layer 36 is Ni pleated as one example. By providing the plated layer 36, the wettability of the metal electrode of the semiconductor chip 40 and the solder layer, which is a bonding member, can be improved, and the bonding of the wiring members can be enhanced. The plated layer 36 may be provided on the entire upper surface of the metal electrode, or the plated layer 36 may be provided on the majority of the upper surface of the metal electrode.

The resin case 10 is provided to enclose a space 94 housing the semiconductor chip 40. The insulating substrate 21 is provided under the resin case 10. Note that the space 94 may be a region above the insulating substrate 21 and a region enclosed by the resin case 10.

In this example, the resin case 10 is molded from a resin such as a thermosetting resin that can be formed by injection molding, or a UV-curing resin that can be formed by UV molding. The resin may include one or more polymer materials selected from, for example, polyphenylene sulfide (PPS) resin, polybutylene terephthalate (PBT) resin, polyamide (PA) resin, acrylonitrile butadiene styrene (ABS) resin, and acrylic resin and so on.

The cooling portion 20 includes a refrigerant such as water inside. The cooling portion 20 cools the semiconductor chip 40 via the insulating substrate 21 or the like. Also, a heat releasing board may also be provided between the cooling portion 20 and the insulating substrate 21. The cooling portion 20 may also cool the semiconductor chip 40 via the heat releasing board.

The upper surface of the semiconductor chip 40 is connected to the wiring member via the plated layer 36 and the solder layer 32 that is a bonding member. The wiring member of this example is a lead frame 60. The lead frame 60 is a member formed of a metal material such as copper or aluminum or the like. The lead frame 60 may have at least a part of the front surface plated by nickel. Also, the lead frame 60 may have at least a part of the front surface coated by resin or the like. The lead frame 60 may have a board-shaped part. "Board-shaped" refers to a shape where the area of the two main surfaces provided opposite is greater than the area of the other surfaces. The lead frame 60 may at least have the part connected to the semiconductor chip 40 to be board-shaped. The lead frame 60 may be formed by folding a piece of metal plate.

The lead frame 60 electrically connects the semiconductor chip 40 and the circuit pattern 26. A main current may flow through the lead frame 60. Herein, the "main current" refers to a maximum current among the currents flowing through the semiconductor chip 40. The lead frame 60 of this example includes a chip connection portion 62, a bridging portion 64, a circuit pattern connection portion 66 and a foot portion 68. The chip connection portion 62 is a part connected to the upper surface of the semiconductor chip 40. The circuit pattern connection portion 66 is a part connected to the upper surface of the circuit pattern 26. The chip connection portion 62 and the circuit pattern connection portion 66 may be the board-shaped parts approximately parallel to the XY plane. Accordingly, the chip connection portion 62 and the circuit pattern connection portion 66 may be the board-shaped parts approximately parallel to the upper surface of the semiconductor chip 40. Note that "approximately parallel" refers to a state in which the angle is 10 degree or less, for example.

A foot portion 68 is a part extending in the Z axis direction. The bridging portion 64 connects the chip connection portion 62 and the circuit pattern connection portion 66 via the foot portion 68. The bridging portion 64 is provided away from the conductive members such as the circuit pattern 26. The bridging portion 64 in this example is provided above the circuit pattern 26 or the like, to span the circuit pattern 26 or the like from the chip connection portion 62 to the circuit pattern connection portion 66.

In this example, the sealing resin 12 is provided inside the resin case 10. The sealing resin 12 seals the semiconductor chip 40 and the lead frame 60 that functions as a wiring member. That is, the sealing resin 12 covers the entire of the semiconductor chip 40 and the lead frame 60 so that the semiconductor chip 40 and the lead frame 60 are not exposed. With the sealing resin 12, the semiconductor chip 40 and the lead frame 60 can be protected.

The solder layer 32 is formed between the upper surface of the semiconductor chip 40 and the lower surface of the chip connection portion 62 of the lead frame 60, and is configured to connect mechanically and electrically the semiconductor chip 40 and the chip connection portion 62. In this example, the solder layer 32 uses lead-free solder. Lead-free solder is, for example, mainly composed of at least one of alloys among tin-silver-copper alloy, tin-zinc-bismuth alloy, tin-copper alloy, tin-silver-indium-bismuth alloy. Also, the solder layer 32 may also have fillets on the side surfaces. The solder layer 32 may be provided only between the upper surface of the semiconductor chip 40 and the lower surface of the chip connection portion 62 of the lead frame 60.

Figure 2:
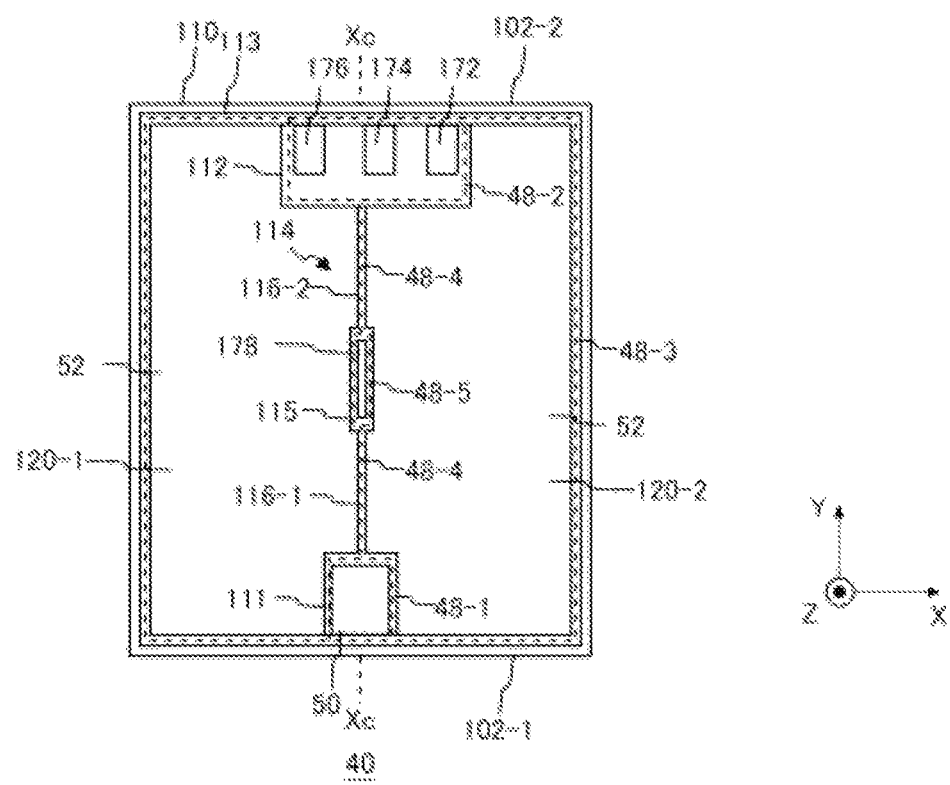
FIG. 2 illustrates one example of an arrangement of a gate runner 48, a well region and a pad region of a semiconductor chip 40 in a top view.

FIG. 2 illustrates one example of an arrangement of a gate runner 48, a well region and a pad region of the semiconductor chip 40 in the top view. The semiconductor chip 40 includes a semiconductor substrate 110. The semiconductor substrate 110 is a substrate formed of a semiconductor material such as silicon or a compound semiconductor. The semiconductor substrate 110 has an edge side 102 in the top view. The semiconductor substrate 110 of this example includes two sets of edge sides 102 facing each other in the top view. In FIG. 2, the set of the edge side 102-1 and the edge side 102-2 facing each other are illustrated. In FIG. 2, the direction parallel to the edge side 102-1 and the edge side 102-2 is referred to as the X axis direction, and the direction vertical to the edge side 102-1 and the edge side 102-2 is referred to as the Y axis direction.

An active portion 120 is provided on the semiconductor substrate 110. In this example, an active portion 120-1 and an active portion 120-2 are provided on the semiconductor substrate 110. The active portion 120 is a region where a main current flows in the depth direction between the upper surface and the lower surface of the semiconductor substrate 110 when the semiconductor chip 40 is controlled to be in an on state. Accordingly, the region inside the well region in FIG. 1 may be referred to as the active portion 120. A transistor portion including a transistor device such as an IGBT may be provided in the active portion 120. A diode portion including a diode device such as a FWD may be provided in the active portion 120. The active portion 120 may be a region provided with at least one of the transistor portion and the diode portion. The active portion 120 may be a region overlapping with the upper surface main electrode in a top view. The upper surface main electrode may be the electrode with the maximum area in the top view among the electrodes provided above the upper surface of the semiconductor substrate 110. The upper surface main electrode may be connected electrically to the emitter region or the source region of the transistor portion, or may be electrically connected to the anode region of the diode portion, for example In the example of FIG. 2, the metal electrode 52 is an upper surface main electrode.

A well region of P-type is provided on the semiconductor substrate 110. The well region is a base region of the transistor portion, or a P type region with a higher concentration than the anode region of the diode portion. The base region is provided opposite to the gate metal layer, and is a P type region having a channel formed in a portion opposite to the gate metal layer when a predetermined gate voltage is applied on the gate metal layer. The semiconductor chip 40 includes a first well region 111 and a second well region 112. The first well region 111 and the second well region 112 are provided sandwiching the active portion 120 in the top view. The first well region 111 and the second well region 112 are provided sandwiching the active portion 120 in a predetermined direction (the Y axis direction in FIG. 2). The two well regions sandwiching the active portion 120 refers to that any straight line connecting the two well regions passing through the active portion 120 in a top view.

The first well region 111 may be provided in the vicinity of the edge side 102-1. That is, the distance between the first well region 111 and the edge side 102-1 may be shorter than the distance between the first well region 111 and the edge side 102-2. The second well region 112 may be provided in the vicinity of the edge side 102-2. That is, the distance between the second well region 112 and the edge side 102-2 may be shorter than the distance between the second well region 112 and the edge side 102-1.

The first well region 111 of this example is provided between the active portion 120 and the edge side 102-1 in the Y axis direction. An active portion 120 is not provided between the first well region 111 and the edge side 102-1. That is, the first well region 111 is provided between the end portion of the active portion 120 in the Y axis direction and the edge side 102-1.

The second well region 112 of this example is provided between the active portion 120 and the edge side 102-2 in the Y axis direction. An active portion 120 is not provided between the second well region 112 and the edge side 102-2. That is, the second well region 112 is provided between the end portion of the active portion 120 in the Y axis direction and the edge side 102-2.

The first well region 111 and the second well region 112 may be provided in a range including the central position Xc of the edge side 102-1 and the edge side 102-2 in the X axis direction. The first well region 111 may be sandwiched by the active portions 120 in the X axis direction. The second well region 112 may be sandwiched by the active portions 120 in the X axis direction. The second well region 112 may be provided in a wider range than the first well region 111 in the X axis direction.

The semiconductor chip 40 may include a peripheral well region 113 provided enclosing the active portion 120 in the top view. The peripheral well region 113 may be provided parallel with each edge side of the semiconductor substrate 110. The peripheral well region 113 of this example is an annular region enclosing the active portion 120 in the top view. The peripheral well region 113 may have a fixed width in the direction vertical to each edge side.

The first well region 111 and the second well region 112 in this example may protrude more toward the central side of the active portion 120 than the peripheral well region 113. In another example, at least one of the first well region 111 and the second well region 112 may be provided between the peripheral well region 113 and the edge side 102 of the semiconductor substrate 110. In this case, the first well region 111 and the second well region 112 protrude from the peripheral well region 113 to the edge side 102 side.

The semiconductor chip 40 may include a dividing well region 114 dividing the active portion 120 in the top view. The active portion 120 may be divided into an active portion 120-1 and an active portion 120-2 by the well region including the dividing well region 114. The dividing well region 114 may include a longitudinal length in a predetermined well longitudinal direction. The dividing well region 114 extends in the well longitudinal direction and transverses the active portion 120. The well longitudinal direction of the dividing well region 114 is the Y axis direction.

The dividing well region 114 may be provided between the first well region 111 and the second well region 112. One end of the longitudinal direction of the dividing well region 114 may be connected to the first well region 111, and the other end may be connected to the second well region 112. The dividing well region 114 may be provided in a region overlapping with the center of the active portion 120.

The dividing well region 114 may include a wide portion 115 with a width in the direction vertical to the well longitudinal direction in the top view (the X axis direction in this example) wider than the other portions. The wide portion 115 is also provided between the first well region 111 and the second well region 112. The wide portion 115 may be provided in a region overlapping the center of the active portion 120. The wide portion 115 may be provided in a region including the center in the well longitudinal direction of the dividing well region 114.

In the dividing well region 114, the portion with a width in the direction vertical to the well longitudinal direction in the top view (the X axis direction in this example) narrower than the wide portion 115 is referred to as a narrow portion 116. The dividing well region 114 includes a narrow portion 116-1 provided on the first well region 111 side and a narrow portion 116-2 provided on the second well region 112 side. The end portions of the well longitudinal direction of the wide portion 115 are respectively connected with the narrow portion 116-1 and the narrow portion 116-2.

The semiconductor chip 40 of this example includes control electrodes such as a gate pad 50, a current detection pad 172, an anode pad 174 and a cathode pad 176. The gate pad 50 is provided above the first well region 111. The current detection pad 172, the anode pad 174 and the cathode pad 176 are provided above the second well region 112.

The temperature sensing diode 178 is a PN bonding diode formed of a semiconductor material such as polysilicon. The temperature sensing diode 178 is provided above the wide portion 115. That is, at least a part of the temperature sensing diode 178 overlaps with at least a part of the wide portion 115. The temperature sensing diode 178 of this example has a half or more of its region overlapping with the wide portion 115 in the top view. The temperature sensing diode 178 may also entirely overlaps with the wide portion 115.

The metal electrode 52 and each control electrode are electrodes including metal such as aluminum. An interlayer dielectric film is provided between the metal electrode 52 and each control electrode, and the semiconductor substrate 110. The metal electrode 52 and each control electrode, and the semiconductor substrate 110 are connected via a contact hole provided on the interlayer dielectric film In FIG. 2, the interlayer dielectric film and the contact holes are omitted.

The metal electrode 52 is provided above the active portion 120. The metal electrode 52 is connected to the active portion 120 via the above-mentioned contact hole. A wiring member is connected to the upper surface of the metal electrode 52, and a predetermined emitter voltage is also applied to the upper surface of the metal electrode 52. The metal electrode 52 and each control electrode are provided away from each other in the top view. Wires or the like are connected to the upper surface of each control electrode. The metal electrode 52 may be provided for each of the active portion 120-1 and the active portion 120-2. Also, the metal electrode 52 is also connected with the well region (refer to FIG. 5).

A predetermined gate voltage is applied onto the gate pad 50. The gate voltage applied to the gate pad 50 is supplied to the transistor portion of the active portion 120 by the gate runner 48 or the like described below. The gate pad 50 is provided above the first well region 111. That is, at least a part of the gate pad 50 overlaps with at least a part of the first well region 111. The gate pad 50 of this example has half or more of its region overlapping with the first well region 111 in the top view. The gate pad 50 may also entirely overlaps with the first well region 111. The gate pad 50 of this example may be provided in the vicinity of the edge side 102-1 of the semiconductor chip 40. That is, the gate pad 50 is provided between the metal electrode 52 and the edge side 102-1 of the semiconductor chip 40, and a metal electrode 52 is not provided between the gate pad 50 and the edge side 102-1. Furthermore, the gate pad 50 may be provided in a region including a central position Xc in the X axis direction of the semiconductor chip 40 and the edge side 102-1.

The current detection pad 172 is connected to the current detection portion (not illustrated), and configured to detect the current flowing through the current detection portion. The anode pad 174 is connected to the anode region of the temperature sensing diode 178 via sense wiring (refer to FIG. 5). The cathode pad 176 is connected to the cathode region of the temperature sensing diode 178 via sense wiring (refer to FIG. 5). Note that the sense wiring may be provided above the wide portion 115 and the narrow portion 116-1.

The current detection pad 172, the anode pad 174 and the cathode pad 176 are provided above the second well region 112. For each control electrode of the current detection pad 172, the anode pad 174 and the cathode pad 176, at least a part of the control electrodes overlap with at least a part of the second well region 112. The current detection pad 172, the anode pad 174 and the cathode pad 176 of this example have a half or more of their regions overlapping with the second well region 112 in the top view. The current detection pad 172, the anode pad 174 and the cathode pad 176 may entirely overlap with the second well region 112. Each control electrode of the current detection pad 172, the anode pad 174 and the cathode pad 176 of this example may be provided in the vicinity of the edge side 102-2 of the semiconductor chip 40. That is, each control electrode of the current detection pad 172, the anode pad 174 and the cathode pad 176 is provided between the metal electrode 52 and the edge side 102-2 of the semiconductor chip 40, and a metal electrode 52 is not provided between each control electrode and the edge side 102-2. Further, each control electrode may be provided in a region including the central position Xc in the X axis direction of the edge side 102-2 of the semiconductor chip 40. Control electrodes of the gate pad 50, the current detection pad 172, the anode pad 174 and the cathode pad 176 of this example may be respectively provided on the edge sides 102-1 and 102-2 facing each other of the semiconductor chip 40. Further, the control electrodes may be provided facing each other via the dividing well region 114.

In FIG. 2, the gate runner 48 is illustrated by dashed lines. In this example, the gate runner 48 is wiring formed of polysilicon with impurities added thereto. The gate runner 48 may be formed of a conductive material such as metal. The gate runner 48 supplies the gate voltage applied to the gate pad 50 to the transistor portion provided in the active portion 120. The gate runner 48 may be provided above the well region.

The semiconductor chip 40 may include a gate runner 48-3 provided to enclose the active portion 120 in the top view. The gate runner 48-3 may be provided above the peripheral well region 113. The gate runner 48-3 may be connected to the metal gate runner described below.

The semiconductor chip 40 may include a gate runner 48-1 enclosing at least a part of the region of the first well region 111 in the top view. The gate runner 48-1 may be provided to be along the edge side of the first well region 111 in the top view. The gate runner 48-1 may include a part parallel to each edge side of the first well region 111.

The semiconductor chip 40 may include a gate runner 48-2 enclosing at least a part of the region of the second well region 112 in the top view. The gate runner 48-2 may be provided along the edge side of the second well region 112 in the top view. The gate runner 48-2 may include a part parallel to each edge side of the second well region 112.

The semiconductor chip 40 may include a gate runner 48-4 provided above the narrow portion 116 in the top view. The semiconductor chip 40 may include a gate runner 48-5 enclosing at least a part of the region of the wide portion 115 in the top view. The gate runner 48-5 may be provided along the edge side of the wide portion 115 in the top view. The gate runner 48-5 may include a part parallel to each edge side of the wide portion 115. The gate runner 48-4 and the gate runner 48-5 may divide the active portion 120 in the top view.

The semiconductor chip 40 may also include an edge termination structure portion between the peripheral well region 113 and the edge side of the semiconductor substrate 110. The edge termination structure portion reduces an electric field strength on the upper surface side of the semiconductor substrate 110. The edge termination structure portion includes, for example, a guard ring provided in an annular shape with surrounding the active portion 120, a field plate, RESURF and a combined structure thereof. Herein, the edge termination structure portion is omitted.

Figure 3:
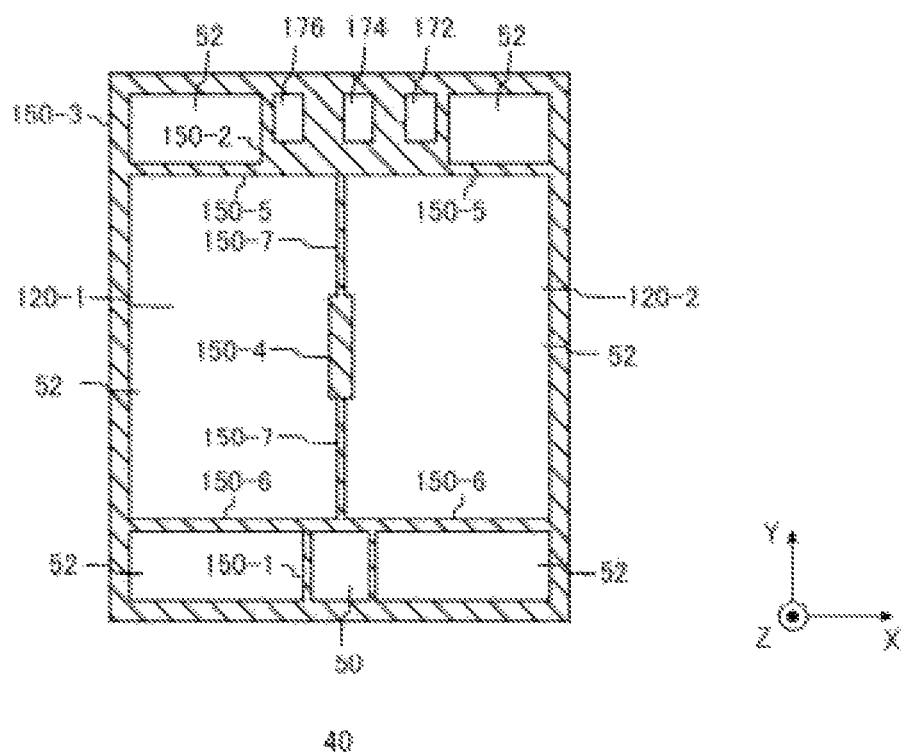
FIG. 3 illustrates one example of an arrangement of a protective film 150 of the semiconductor chip 40 in a top view.

FIG. 3 illustrates one example of an arrangement of the protective film 150 of the semiconductor chip 40 in the top view. In FIG. 3, the region wherein the protective film 150 is arranged is illustrated by hatching with oblique lines. The protective film 150 may be provided above the metal electrode 52 and above the semiconductor substrate 110. The protective film 150 may be in contact with the upper surface of the metal electrode 52. By providing the protective film 150, the upper surface of the semiconductor chip 40 can be protected. The protective film 150 is a polyimide film as one example.

The semiconductor chip 40 may include a protective film 150-1 covering the first well region 111. The protective film 150-1 may cause a part of the upper surface of the gate pad 50 to be exposed. In this way, a wire can be connected to the upper surface of the gate pad 50.

The semiconductor chip 40 may include a protective film 150-2 covering the second well region 112. The protective film 150-2 may cause a part of the upper surfaces of the current detection pad 172, the anode pad 174 and the cathode pad 176 to be exposed. In this way, a wire can be connected to the upper surfaces of the current detection pad 172, the anode pad 174 and the cathode pad 176.

The semiconductor chip 40 may include a protective film 150-3 covering the peripheral well region 113. The protective film 150-3 may cover the entire of the peripheral well region 113. The semiconductor chip 40 may include a protective film 150-4 and a protective film 150-7 covering the dividing well region 114. The entire of the dividing well region 114 may be covered by the protective film 150-4 and the protective film 150-7. In this example, the protective film 150-4 covers the entire of the wide portion 115, and the protective film 150-7 covers the entire of the narrow portion 116.

The protective film 150 causes a part of the upper surface of the metal electrode 52 to be exposed. In this way, a wire can be easily connected to the upper surface of the metal electrode 52.

The semiconductor chip 40 may include a protective film 150-5 and a protective film 150-6 dividing the upper surface of the semiconductor substrate 110. The protective film 150-5 and the protective film 150-6 may be provided traversing the upper surface of the semiconductor substrate 110 in the X axis direction.

Figure 4:
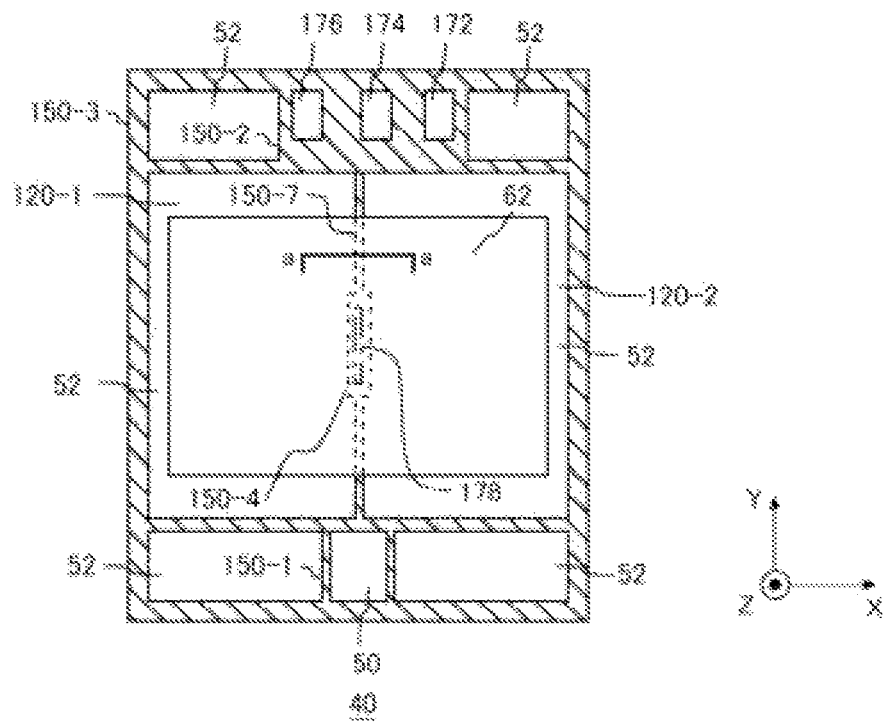
FIG. 4 illustrates one example of an arrangement of the semiconductor chip 40 and a chip connection portion 62 in a top view of the semiconductor module 100 according to a comparative example

FIG. 4 illustrates one example of an arrangement of the semiconductor chip 40 and the chip connection portion 62 in the top view of the semiconductor module 100 according to the comparative example In FIG. 4, one example of an arrangement of the chip connection portion 62 of the lead frame 60 in the semiconductor chip 40 is illustrated. In FIG. 4, the protective film 150 overlapping with the chip connection portion 62 is illustrated by dotted lines. Also, in FIG. 4, the temperature sensing diode 178 overlapping with the chip connection portion 62 is illustrated by dashed-dotted lines.

In this example, the chip connection portion 62 is provided to overlap with the protective film 150-4 and the protective film 150-7 in the top view. Accordingly, the chip connection portion 62 overlaps with the temperature sensing diode 178 and the sense wiring (not illustrated in FIG. 4) in the top view.

Figure 5:
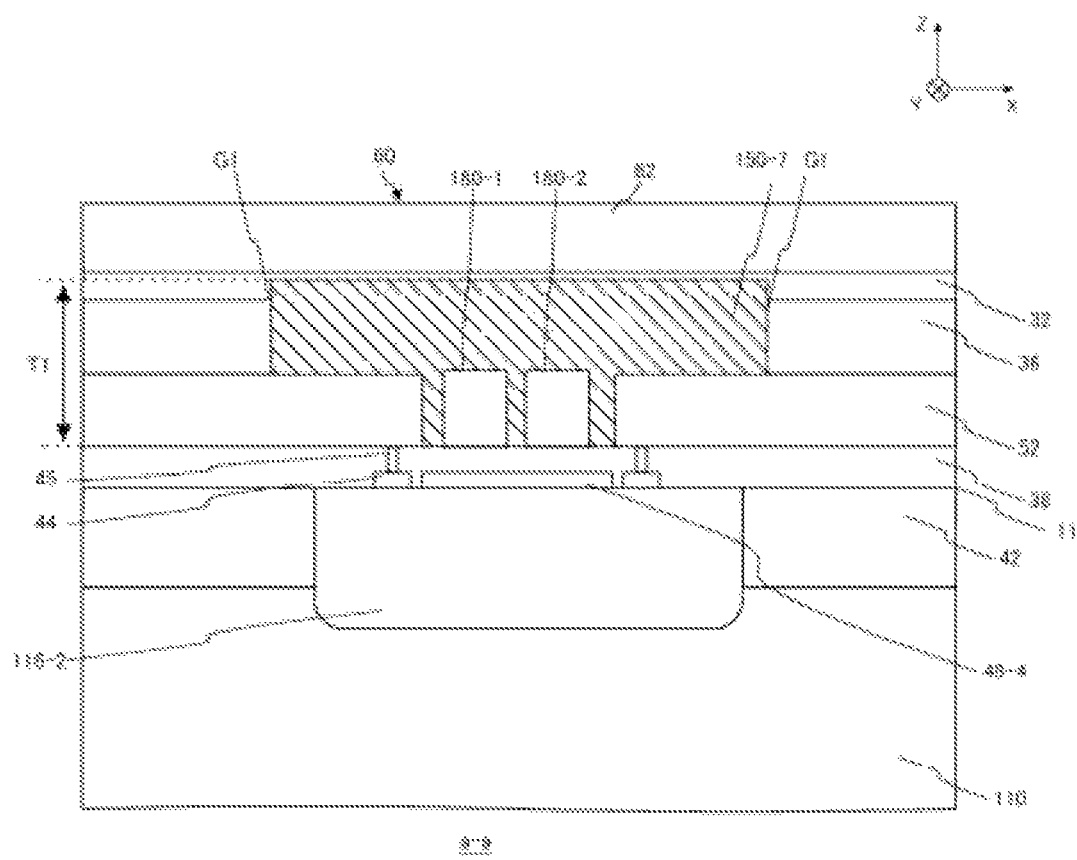
FIG. 5 illustrates one example of a semiconductor module 100 in a cross section a-a of FIG. 4.

FIG. 5 illustrates one example of the semiconductor module 100 in a cross section a-a in FIG. 4. The cross section a-a is a cross section on the XZ plane. In the cross section, the semiconductor module 100 includes a solder layer 32, a plated layer 36, a interlayer dielectric film 38, a connection portion 44, a gate runner 48-4, a metal electrode 52, a chip connection portion 62 of the lead frame 60, a semiconductor substrate 110 and a protective film 150-7. In the cross section, the lower surface of the semiconductor substrate 110 is omitted.

On the upper surface 11 of the semiconductor substrate 110, a trench portion 42 is provided. The trench portion 42 may be a gate trench portion. That is, the conductive portion inside the trench portion 42 may be connected electrically to the control electrode of the gate pad 50. The trench portion 42 may include an insulation film.

An interlayer dielectric film 38 may be provided between the metal electrode 52 and the semiconductor substrate 110 in the cross section. Also, the interlayer dielectric film 38 includes a contact hole 45. The metal electrode 52 is connected to the connection portion 44 via the contact hole 45.

The connection portion 44 may be formed of the same material as the gate runner 48. That is, the connection portion 44 may be wiring formed of polysilicon with impurities added thereto. By providing the connection portion 44, the well region (in this example, the narrow portion 116-2 of the dividing well region 114) and the metal electrode 52 can be electrically connected.

The metal electrode 52 is provided above the semiconductor substrate 110. In this example, the metal electrode 52 is provided on the upper surface of the interlayer dielectric film 38.

In the cross section, the semiconductor module 100 includes sense wiring 180. The sense wiring 180-1 connects the anode region and the anode pad 174 of the temperature sensing diode 178. The sense wiring 180-2 connects the cathode region and the cathode pad 176 of the temperature sensing diode 178.

The sense wiring 180 is provided above the semiconductor substrate 110. In this example, the sense wiring 180 is provided on the upper surface of the interlayer dielectric film 38. The sense wiring 180 may be provided with at least a part being in a height identical to the metal electrode 52.

Also, in the cross section, although the sense wiring 180 is illustrated, the temperature sensing diode 178 may also be provided in a height identical to the sense wiring 180. That is, the temperature sensing diode 178 may be provided above the semiconductor substrate 110. The temperature sensing diode 178 may be provided on the upper surface of the interlayer dielectric film 38. The temperature sensing diode 178 may be provided having at least a part being in a height identical to the metal electrode 52.

In the cross section, the protective film 150-7 is provided above the metal electrode 52. The protective film 150-7 is provided above the sense wiring 180. In this example, the protective film 150-7 covers the sense wiring 180. Also, in another cross section, the protective film 150-4 may be provided above the temperature sensing diode 178. The protective film 150-4 may cover the temperature sensing diode 178. In a word, the protective film 150 may cover the temperature sensing diode 178 and the sense wiring 180. The thickness T1 of the protective film 150 may be from 1 μm to 20 μm.

The plated layer 36 is provided above the metal electrode 52. In this example, the plated layer 36 is provided on the upper surface of the metal electrode 52. The plated layer 36 may be provided having at least a part being in a height identical to the protective film 150.

The solder layer 32 is provided above the plated layer 36. In this example, the solder layer 32 is provided between the chip connection portion 62 of the lead frame 60 and the plated layer 36. Also, in FIG. 5, the solder layer 32 is provided above the protective film 150-7. In this example, the solder layer 32 is provided between the chip connection portion 62 of the lead frame 60 and the protective film 150-7. The chip connection portion 62 of the lead frame 60 is provided above the solder layer 32. The solder layer 32 may be provided having at least a part being in a height identical to the protective film 150. Also, the protective film 150 is provided in a location lower than the lead frame 60 in a height direction (the Z axis direction). In this example, the protective film 150 is provided under the chip connection portion 62 of the lead frame 60.

In this example, there is a point where the solder layer 32, the plated layer 36 and the protective film 150-7 are in contact. The point is referred to as a triple point G1. If the triple point G1 exists, a stress concentration occurs on the triple point G1 from the repeated stresses due to heat. Accordingly, it is preferable to not provide a triple point G1 in the semiconductor module 100 in or der to prevent the stress concentration.

Figure 6:
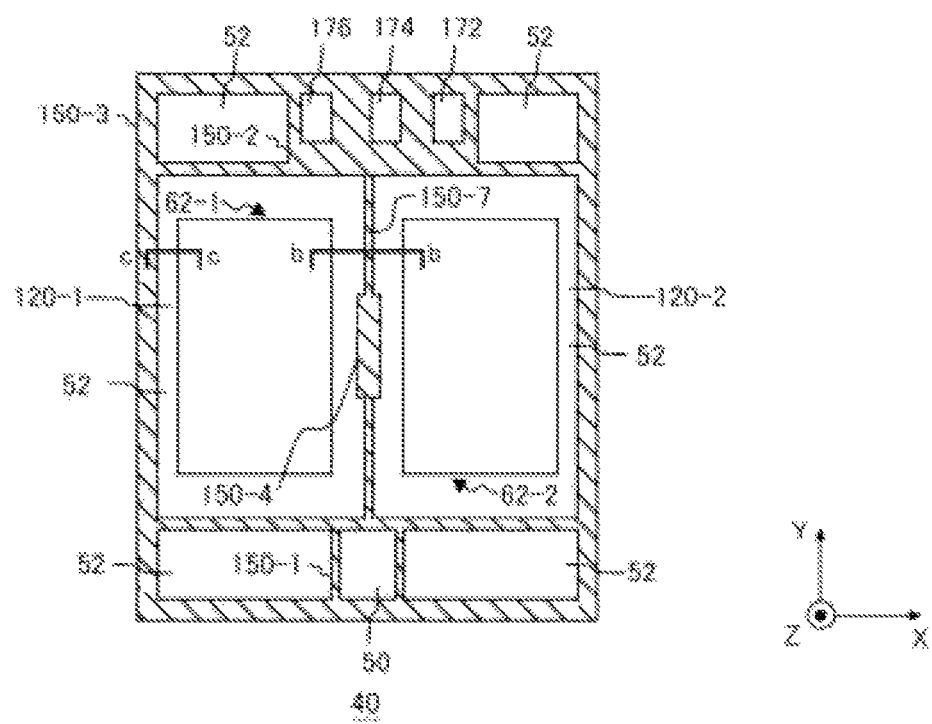
FIG. 6 illustrates one example of an arrangement of the semiconductor chip 40 and the chip connection portion 62 in a top view of the semiconductor module 100 according to an example embodiment.

FIG. 6 illustrates one example of an arrangement of the semiconductor chip 40 and the chip connection portion 62 in the top view of the semiconductor module 100 according to the example embodiment. In FIG. 6, one example of an arrangement of the chip connection portion 62 of the lead frame 60 in the semiconductor chip 40 is illustrated. In FIG. 6, the chip connection portion 62 provided in the active portion 120-1 is referred to as a chip connection portion 62-1, and the chip connection portion 62 provided in the active portion 120-2 is referred to as a chip connection portion 62-2.

Figure 7:
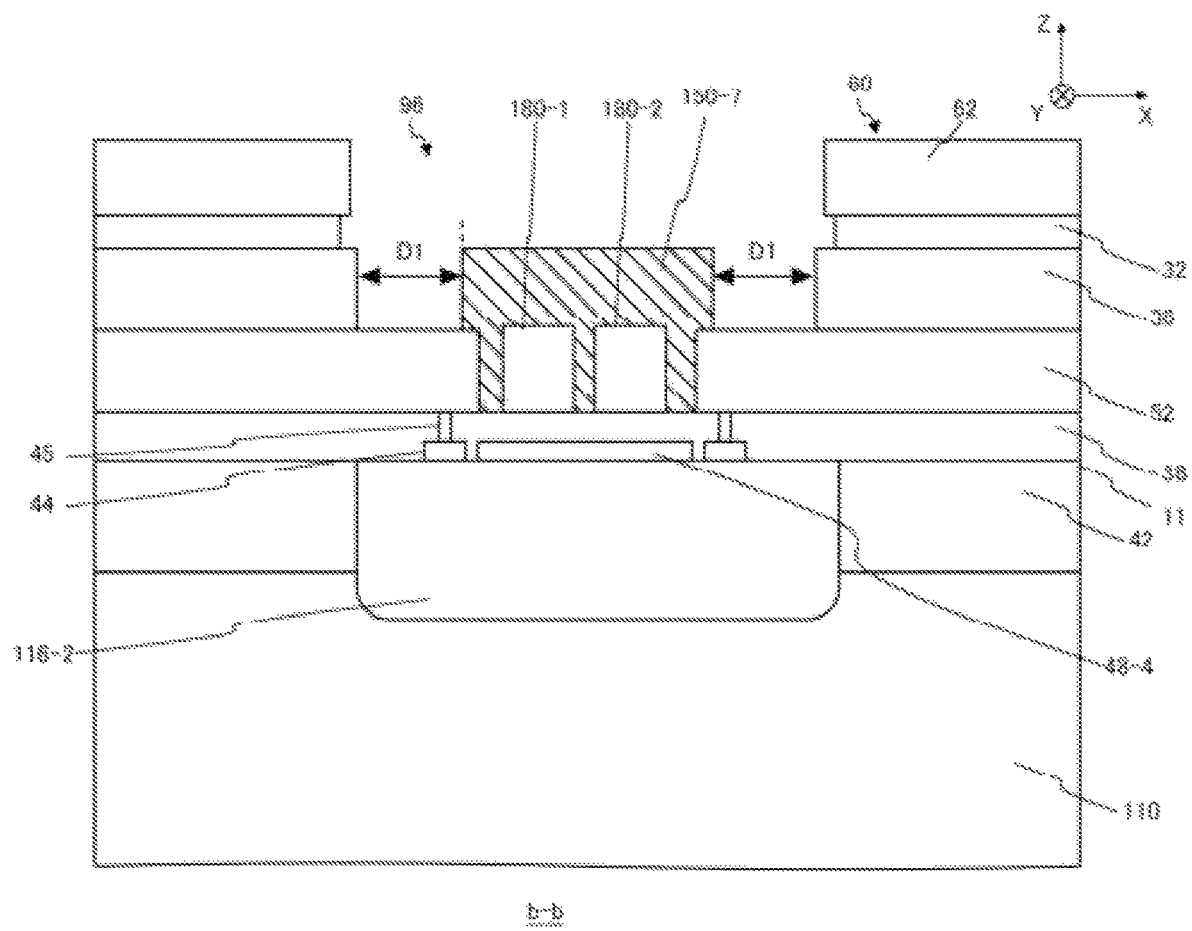
FIG. 7 illustrates one example of the semiconductor module 100 in a cross section b-b of FIG. 6.

FIG. 7 illustrates one example of the semiconductor module 100 in a cross section b-b in FIG. 6. The cross section b-b is a cross section in the XZ plane. In the cross section, the semiconductor module 100 includes a solder layer 32, a plated layer 36, a interlayer dielectric film 38, a connection portion 44, a gate runner 48-4, a metal electrode 52, a chip connection portion 62 of the lead frame 60, a semiconductor substrate 110 and a protective film 150-7. In the cross section, the lower surface of the semiconductor substrate 110 is omitted. In the cross section, the configurations of the solder layer 32, the plated layer 36, and the chip connection portion 62 of the lead frame 60 are different from the cross section in FIG. 5. The other configurations in FIG. 7 may be identical to those in FIG. 5.

In this example, the plated layer 36 is provided in a range not in contact with the protective film 150. In the cross section, the plated layer 36 is not in contact with the protective film 150-7. The plated layer 36 is away from the protective film 150-7. That is, the semiconductor module 100 has a space 96 between the plated layer 36 and the protective film 150-7. A triple point does not exist since the plated layer 36 is away from the protective film 150. Accordingly, the stress concentration due to the triple point can be prevented. The shortest distance D1 between the plated layer 36 and the protective film 150 may be from 10 µm to 300 µm. Note that the space 96 may be filled with the sealing resin 12 mentioned above. In this example, the sealing resin 12 is omitted.

Also, in this example, the solder layer 32 is provided in a range not in contact with the protective film 150. In the cross section, the solder layer 32 is not in contact with the protective film 150-7. The solder layer 32 is away from the protective film 150-7. That is, the semiconductor module 100 has a space 96 between the solder layer 32 and the protective film. A triple point does not exist since the solder layer 32 is away from the protective film 150. Accordingly, the stress concentration due to the triple point can be prevented.

In this example, the protective film 150 covering the temperature sensing diode 178 or the sense wiring 180 is away from the solder layer 32 and the plated layer 36. In the cross section, the protective film 150-7 covering the sense wiring 180 is away from the solder layer 32 and the plated layer 36. Also, in another cross section (not illustrated), the protective film 150-4 covering the temperature sensing diode 178 may be away from the solder layer 32 and the plated layer 36. In this way, since the protective film 150 covering the temperature sensing diode 178 or the sense wiring 180 is away from the solder layer 32 and the plated layer 36, a triple point does not exist in the vicinity of the temperature sensing diode 178 and the sense wiring 180. Accordingly, the stress concentration in the vicinity of the temperature sensing diode 178 and the sense wiring 180 can be prevented.

Also, in FIG. 6, the chip connection portion 62 is provided not to overlap with the protective film 150-4 and the protective film 150-7 in the top view. That is, the chip connection portion 62 can be provided not to overlap with the temperature sensing diode 178 and the sense wiring 180 in the top view. Since the chip connection portion 62 is provided not to overlap with the temperature sensing diode 178 and the sense wiring 180 in the top view, the solder layer 32 may be not provided between the protective film 150 and the chip connection portion 62, and the solder layer 32 can be provided in a range not in contact with the protective film 150. Note that the bridging portion 64, the foot portion 68 and so on of the lead frame 60 may overlap with the temperature sensing diode 178 and the sense wiring 180 in the top view.

Also, in FIG. 6, the chip connection portion 62 may be divided into the chip connection portion 62-1 and the chip connection portion 62-2. By dividing the chip connection portion 62, it becomes easier to fill the sealing resin 12 in the vicinity of the gate runner 48-4, and to ensure the insulation properties of the gate runner 48-4 and the sense wiring 180.

Figure 8:
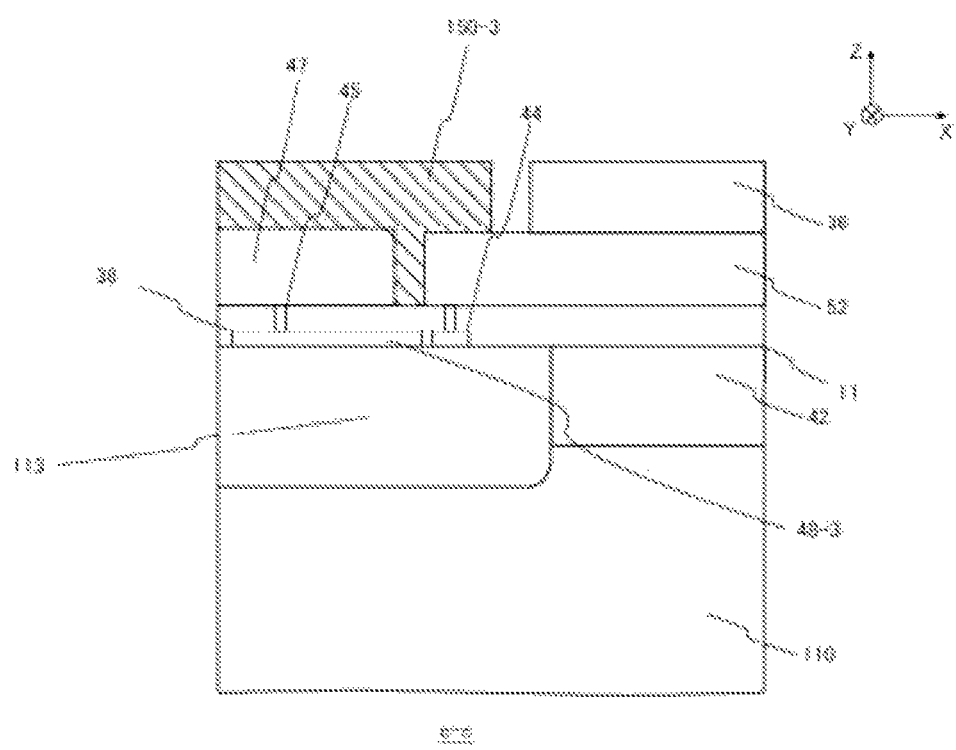
FIG. 8 illustrates one example of the semiconductor module 100 in a cross section c-c of FIG. 6.

FIG. 8 illustrates one example of the semiconductor module 100 in a cross section c-c in FIG. 6. The cross section c-c is a cross section on the XZ plane. In the cross section, the semiconductor module 100 includes a plated layer 36, an interlayer dielectric film 38, a connection portion 44, a metal gate runner 47, a gate runner 48-3, a metal electrode 52, a chip connection portion 62 of the lead frame 60, a semiconductor substrate 110 and a protective film 150-3. In the cross section, the lower surface of the semiconductor substrate 110 is omitted. In this example, the descriptions about the common signs with FIG. 7 are omitted.

The metal gate runner 47 is provided above the semiconductor substrate 110. In this example, the metal gate runner 47 is provided on the upper surface of the interlayer dielectric film 38. The metal gate runner 47 is connected electrically to the gate runner 48-3 via the contact hole 45 provided in the interlayer dielectric film 38. The metal gate runner 47 may be connected electrically to the gate pad 50, and may be applied with a gate voltage. The metal gate runner 47 may be provided above the peripheral well region 113.

The protective film 150-3 covering the metal gate runner 47 is away from the plated layer 36. Also, the protective film 150-3 covering the metal gate runner 47 is away from the solder layer 32 (not illustrated in FIG. 8). By providing the protective film 150-3 covering the metal gate runner 47 to be away from the plated layer 36 and the solder layer 32, a triple point does not exist in the vicinity of the metal gate runner 47. Accordingly, the stress concentration in the vicinity of the metal gate runner 47 can be prevented.

Figure 9:
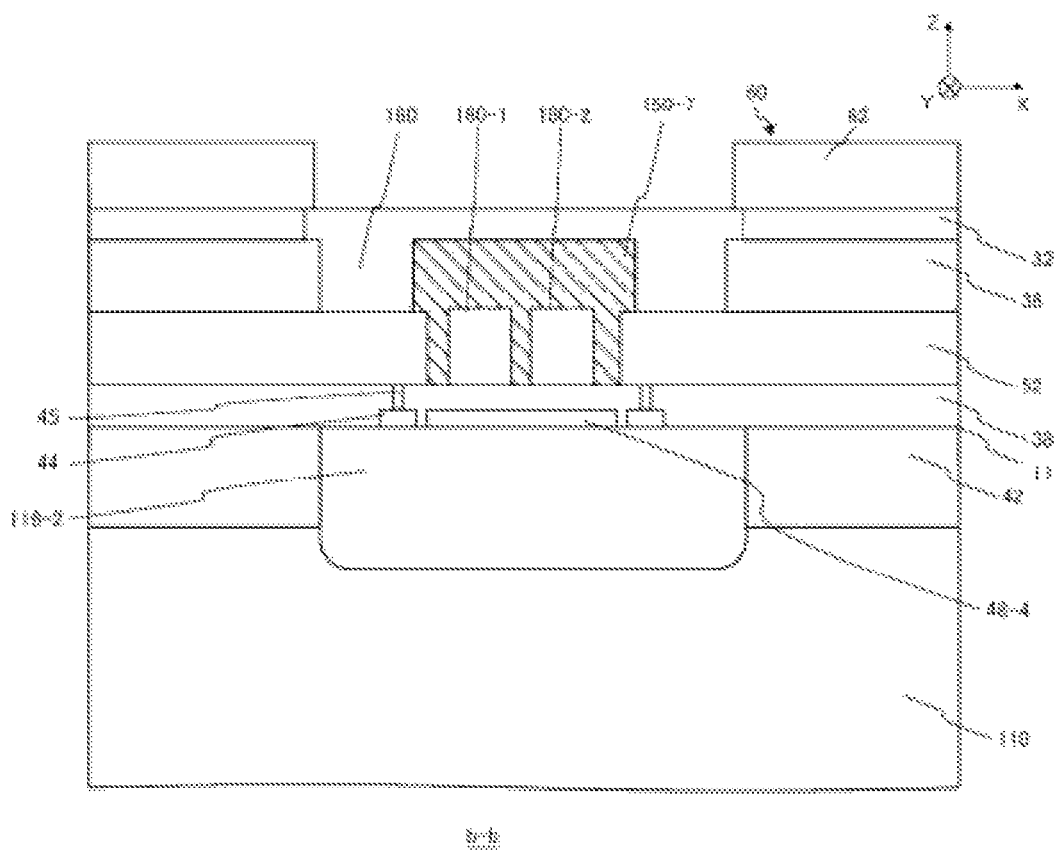
FIG. 9 illustrates another example of the semiconductor module 100 in the cross section b-b of FIG. 6.

FIG. 9 illustrates another example of the semiconductor module 100 in a cross section b-b in FIG. 6. The cross section b-b in FIG. 9 is different from the cross section b-b in FIG. 7 in having a filler material 160 provided between the plated layer 36 and the protective film 150. The other configurations in FIG. 9 may be the same as FIG. 7.

In this example, a filler material 160 is provided between the plated layer 36 and the protective film 150. The filler material 160 fills between the plated layer 36 and the protective film 150. Also, the filler material 160 may be provided between the solder layer 32 and the protective film 150. The filler material 160 may be provided on a sider lower than the chip connection portion 62 of the lead frame 60. With such a configuration, a generation of a triple point can be prevented.

The filler material 160 is preferable to be a material closer to the plated layer 36 and the solder layer 32 than the protective film 150. For example, the filler material 160 may have an elastic modulus smaller than the protective film 150. Since the elastic modulus of the filler material 160 is smaller than the elastic modulus of the protective film 150, the stress concentration becomes harder to occur. In this case, the filler material 160 is silicone resin as one example. It is more preferable that the filler material is silicone gel.

Also, the linear expansion coefficient of the filler material 160 may have a smaller difference of the linear expansion coefficient from the plated layer 36, when compared with the linear expansion coefficient of the protective film 150. The linear expansion coefficient of the filler material 160 may have a smaller difference of the linear expansion coefficient from the linear expansion coefficient of the solder layer 32, when compared with the linear expansion coefficient of the protective film 150. The linear expansion coefficient is a coefficient indicating the ratio of expansion of the length of an object due to the increase in temperature. By making the linear expansion coefficient of the filler material 160 have a difference of the linear expansion coefficient from the linear expansion coefficient of the plated layer 36 or the solder layer 32 smaller when compared with the linear expansion coefficient of the protective film 150, the generation of the stress concentration becomes harder. In this case, the filler material 160 is silicone resin or epoxy resin with the additive amount of the inorganic filler adjusted as one example The filler material 160 may have higher adhesiveness to the metal electrode 52 than the protective film 150. By improving the adhesiveness between the filler material 160 and the metal electrode 52, the protective film 150 can be prevented from peeling off from the metal electrode 52. In this case, the filler material 160 is silicone resin or epoxy resin with its composition adjusted as one example.

The filler material 160 may be a material different from sealing resin 12. For example, it is preferable that the sealing resin 12 is a material having a smaller difference of the linear expansion coefficient from the semiconductor chip 40. On the other hand, it is preferable that the filler material 160 is a material having a smaller difference of the linear expansion coefficient from the plated layer 36 or the solder layer 32. Accordingly, the filler material 160 may be a material with a linear expansion coefficient greater than the sealing resin 12.

By increasing the additive amount of the inorganic filler in order to decrease the heat expansion coefficient, the elastic modulus of the sealing resin 12 accordingly tends to increase. Therefore, it is preferable that the filler material 160 has the elastic modulus smaller than the sealing resin 12.

Also, in order to increase the additive amount of the inorganic filler, the sealing resin 12 tends to have adhesiveness with the metal electrode 52 to be lower. Therefore, it is preferable that the filler material 160 has adhesiveness with the metal electrode 52 higher than the sealing resin 12.

The sealing resin 12 is, as one example, epoxy resin with inorganic filler added with a ratio from 50% to 95% by volume. Note that the filler material 160 may be a material different from the sealing resin 12.

Figure 10:
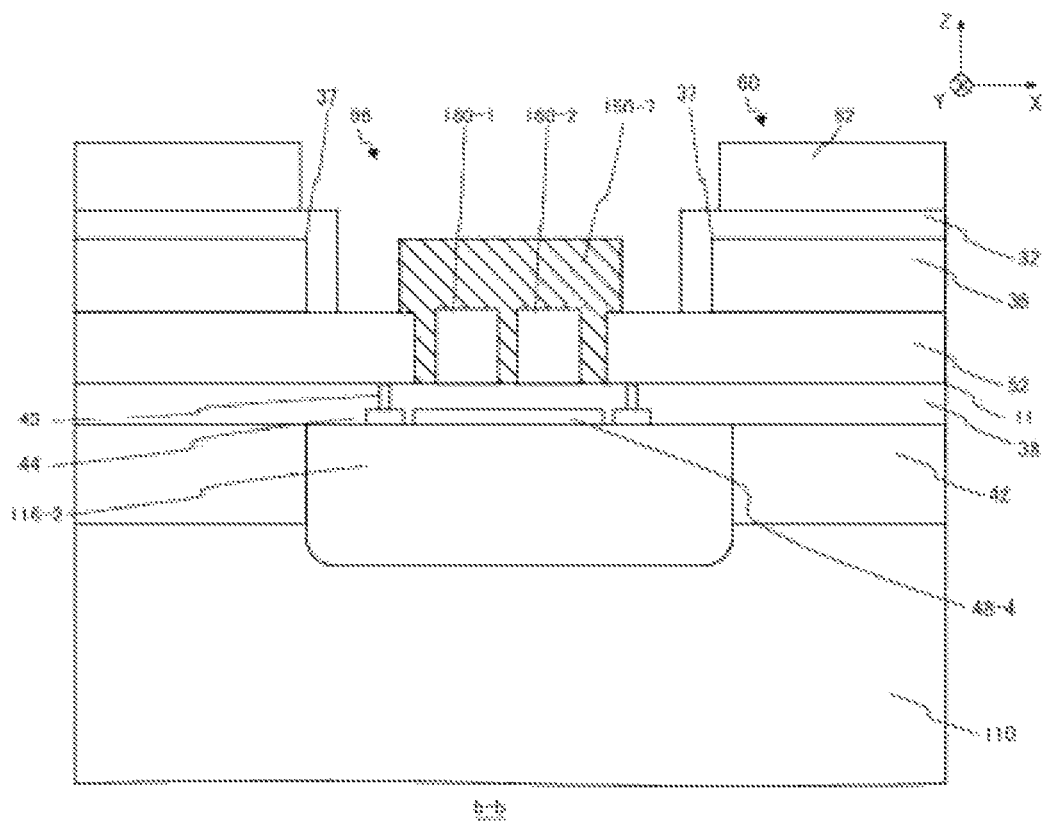
FIG. 10 illustrates another example of the semiconductor module 100 in the cross section b-b of FIG. 6.

FIG. 10 illustrates another example of the semiconductor module 100 in the cross section b-b in FIG. 6. The cross section b-b of FIG. 10 is different from the cross section b-b of FIG. 7 in having a solder layer 32 provided between the plated layer 36 and the protective film 150. The other configurations in FIG. 10 may be identical to those in FIG. 7.

In this example, the solder layer 32 is provided between the plated layer 36 and the protective film 150-7. Also, the side surface of the plated layer 36 is covered by the solder layer 32. In this example, the solder layer 32 covers the corner portion 37 of the plated layer 36 in contact with the solder layer 32. The corner portion 37 of the plated layer 36 is a part where the upper surface and the side surface of the plated layer 36 intersects with each other. With such a configuration, the generation of the triple point and the stress concentration can also be prevented. Note that in this example, although the solder layer 32 is away from the protective film 150, the solder layer 32 may also be in contact with the protective film 150. When the solder layer 32 is in contact with the protective film 150, the generation of the triple point can be prevented.

Figure 11:
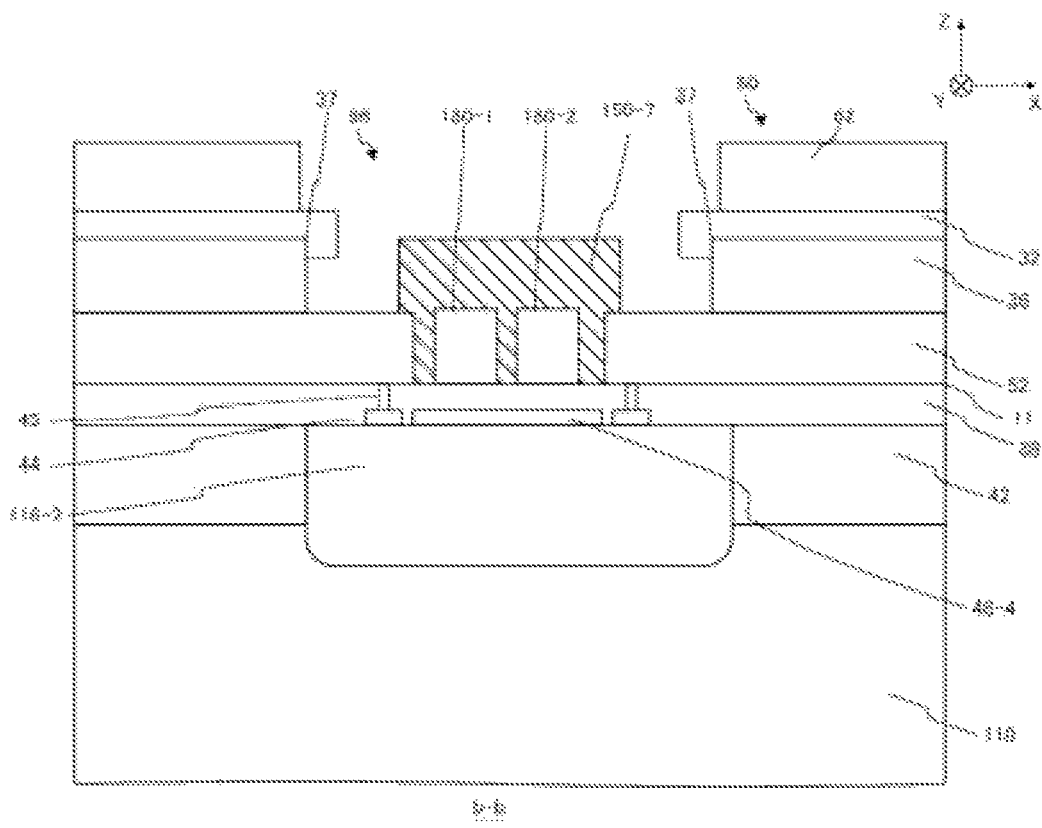
FIG. 11 illustrates another example of the semiconductor module 100 in the cross section b-b of FIG. 6.

FIG. 11 illustrates another example of the semiconductor module 100 in the cross section b-b of FIG. 6. The cross section b-b of FIG. 11 is different from the cross section b-b of FIG. 10 in the configuration of the solder layer 32. The other configurations in FIG. 11 may be identical to those in FIG. 10.

Also in this example, similar to FIG. 10, the solder layer 32 is provided between the plated layer 36 and the protective film 150-7. In this example, different from FIG. 10, a part of the side surface of the plated layer 36 is exposed. That is, the entire of the plated layer 36 is not covered by the solder layer 32. In this example, the solder layer 32 also covers the corner portion 37 of the plated layer 36 in contact with the solder layer 32. With such a configuration, the generation of the triple point and the stress concentration can also be prevented.

Figure 12:
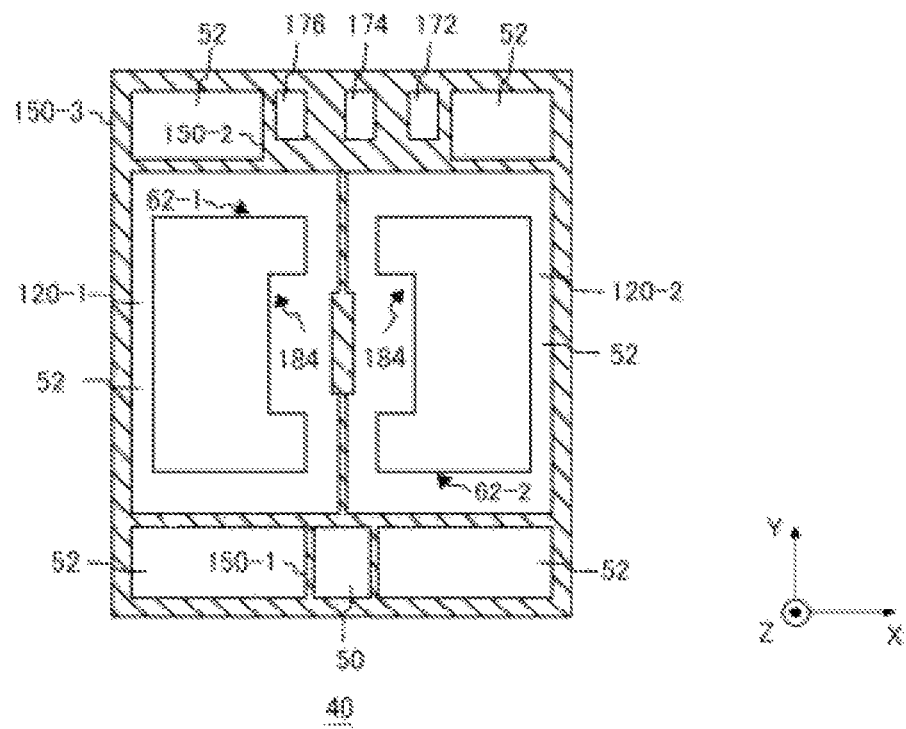
FIG. 12 illustrates another example of an arrangement of the semiconductor chip 40 and the chip connection portion 62 in the top view of the semiconductor module 100 according to the example embodiment.

FIG. 12 illustrates another example of an arrangement of the semiconductor chip 40 and the chip connection portion 62 of the semiconductor module 100 in the top view according to the example embodiment. FIG. 12 is different from FIG. 6 in the configuration of the chip connection portion 62. The other configurations in FIG. 12 may be identical to those in FIG. 6.

In this example, each of the chip connection portions 62 has a concave portion 184. The concave portion 184 may be provided along the shape of the protective film 150. Since the chip connection portion 62 has a concave portion 184, the solder layer 32 can be away from the protective film 150, and the generation of the triple point can be prevented.

Figure 13:
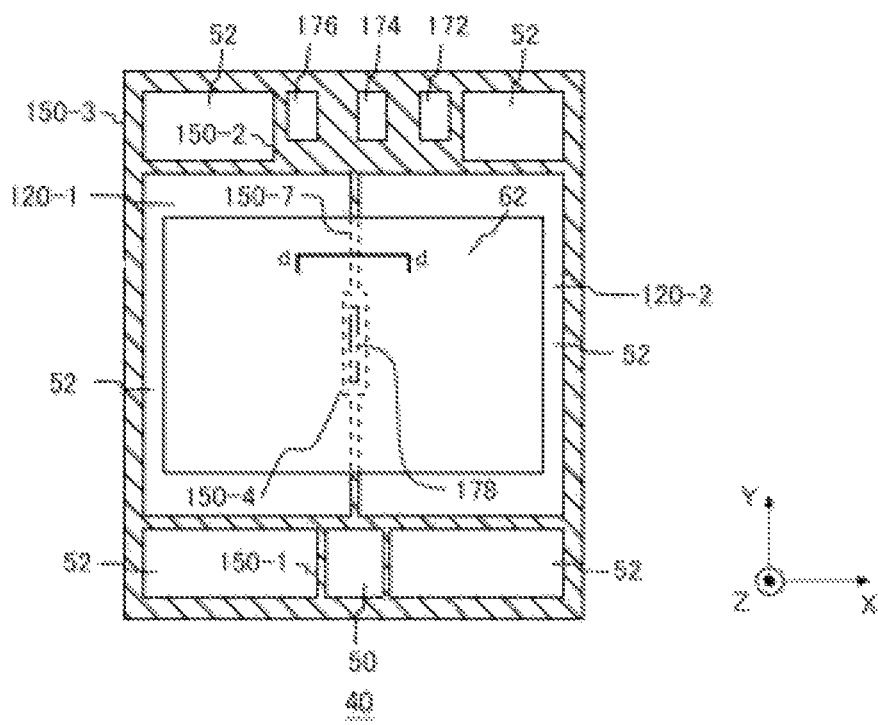
FIG. 13 illustrates another example of an arrangement of the semiconductor chip 40 and the chip connection portion 62 in the top view of the semiconductor module 100 according to the example embodiment.

FIG. 13 illustrates another example of an arrangement of the semiconductor chip 40 and the chip connection portion 62 of the semiconductor module 100 in the top view according to the example embodiment. In FIG. 13, another example of an arrangement of the chip connection portion 62 of the lead frame 60 in the semiconductor chip 40 is illustrated. The arrangement of the semiconductor chip 40 and the chip connection portion 62 in the top view in FIG. 13 may be identical to the arrangement of the semiconductor chip 40 and the chip connection portion 62 in the top view in FIG. 4.

Figure 14:
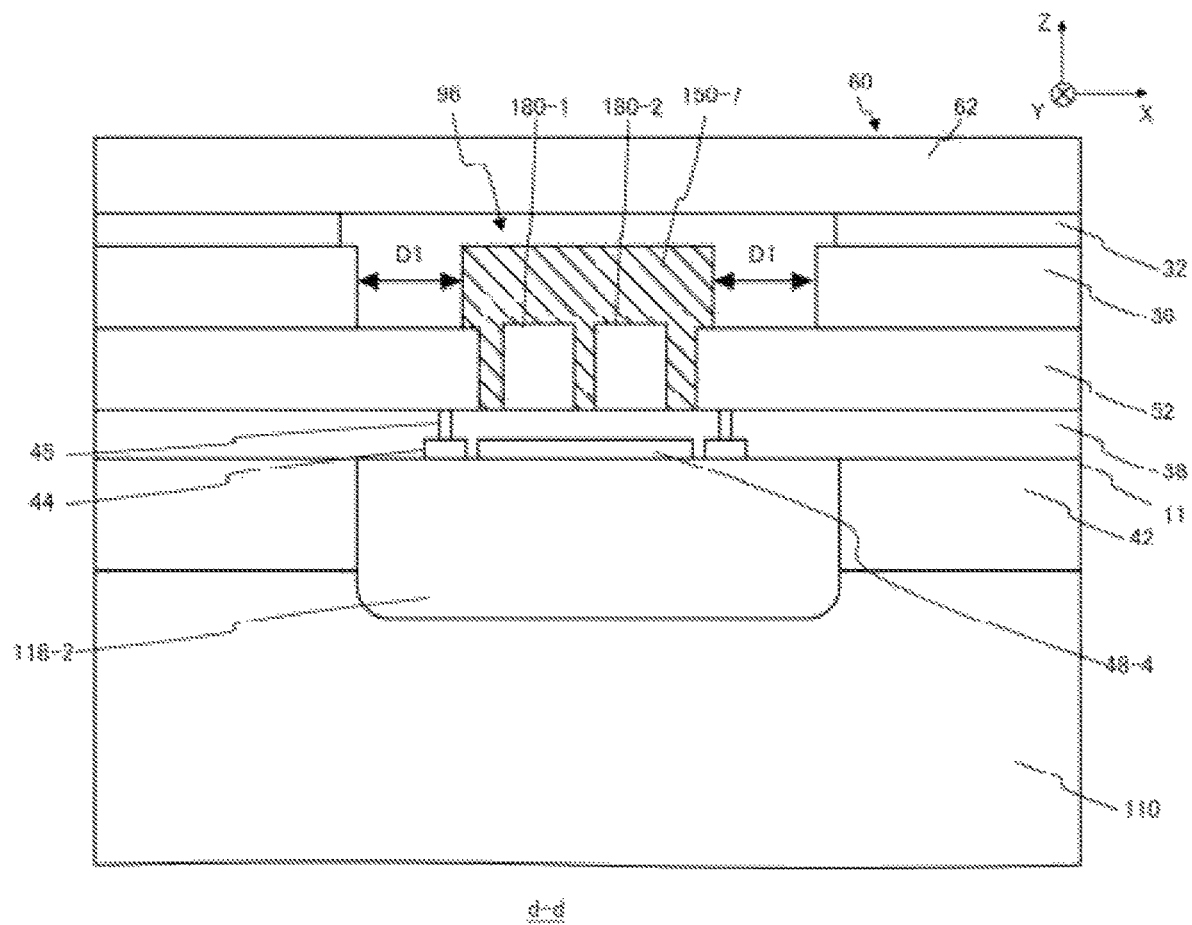
FIG. 14 illustrates one example of the semiconductor module 100 in a cross-section d-d of FIG. 13.

FIG. 14 illustrates one example of the semiconductor module 100 in the cross-section d-d in FIG. 13. The cross-section d-d is a cross section on the XZ plane. In the cross section, the semiconductor module 100 includes a solder layer 32, a plated layer 36, a interlayer dielectric film 38, a connection portion 44, a gate runner 48-4, a metal electrode 52, a chip connection portion 62 of the lead frame 60, a semiconductor substrate 110 and a protective film 150-7. In the cross section, the lower surface of the semiconductor substrate 110 is omitted. In the cross section, the configuration of the chip connection portion 62 of the lead frame 60 is different from the cross section of FIG. 7. The other configurations in FIG. 14 may be identical to those in FIG. 7.

In the cross section, the plated layer 36 is not in contact with the protective film 150-7. The plated layer 36 is away from the protective film 150-7. That is, the semiconductor module 100 has a space 96 between the plated layer 36 and the protective film 150-7. A triple point does not exist since the plated layer 36 is away from the protective film 150. Accordingly, the stress concentration due to the triple point can be prevented. The shortest distance D1 between the plated layer 36 and the protective film 150 may be from 10 µm to 300 µm.

Also this example, the chip connection portion 62 of the lead frame 60 is provided above the protective film 150-7. The chip connection portion 62 covers the protective film 150-7 above the protective film 150-7. Also, the semiconductor module 100 has a space 96 between the chip connection portion 62 and the protective film 150-7. In this example, a solder layer 32 is not provided between the chip connection portion 62 and the protective film 150-7. With such a configuration, the protective film 150 can be away from the plated layer 36, and the stress concentration due to the triple point can be prevented.

Also in FIG. 13, different from FIG. 6, the chip connection portion 62 is not divided. By not dividing the chip connection portion 62, imbalance in current of the active portion 120-1 and the active portion 120-2 is hard to occur. Also, the area of the chip connection portion 62 can be increased, and the heat generation due to the current flowing through the lead frame 60 can be suppressed.

Figure 15:
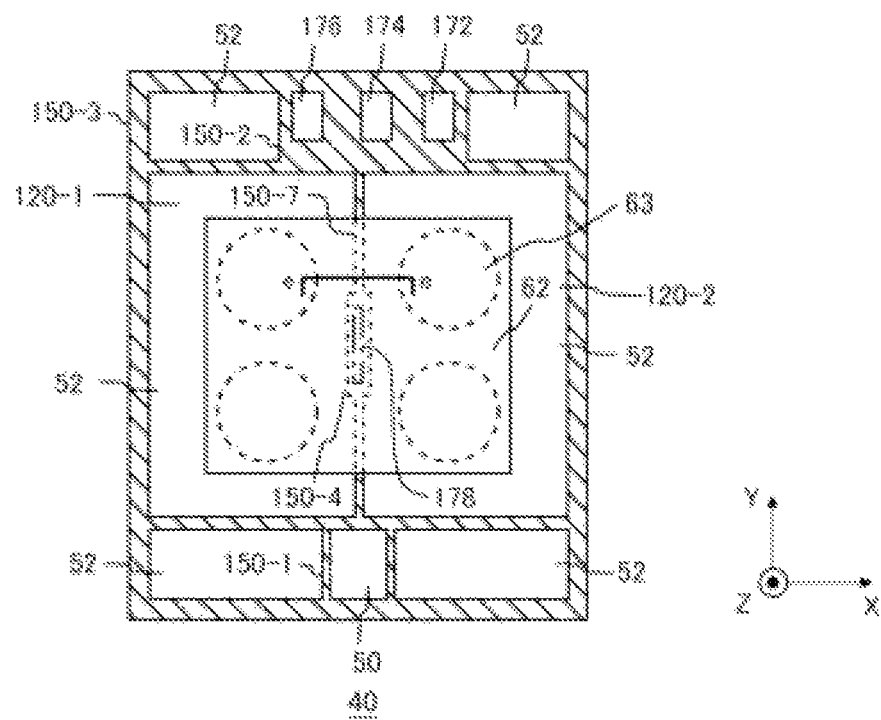
FIG. 15 illustrates another example of an arrangement of the semiconductor chip 40 and the chip connection portion 62 in the top view of the semiconductor module 100 according to the example embodiment.

FIG. 15 illustrates another example of an arrangement of the semiconductor chip 40 and the chip connection portion 62 of the semiconductor module 100 in the top view according to the example embodiment. In FIG. 15, another example of an arrangement of the chip connection portion 62 of the lead frame 60 in the semiconductor chip 40 is illustrated. FIG. 15 is different from FIG. 13 in a point that the chip connection portion 62 includes a protruding portion 63. The other configurations in FIG. 15 may be identical to those in FIG. 13. In FIG. 15, the arrangement of the protruding portion 63 is illustrated by dotted lines.

The chip connection portion 62 may include a plurality of protruding portions 63. In this example, the chip connection portion 62 includes four protruding portions 63. The protruding portions 63 may protrude from the solder layer 32 side. In this example, the protruding portions 63 protrude from the −Z axis direction. It is preferable that the whole protruding portions 63 are provided above the emitter electrode 52.

Figure 16:
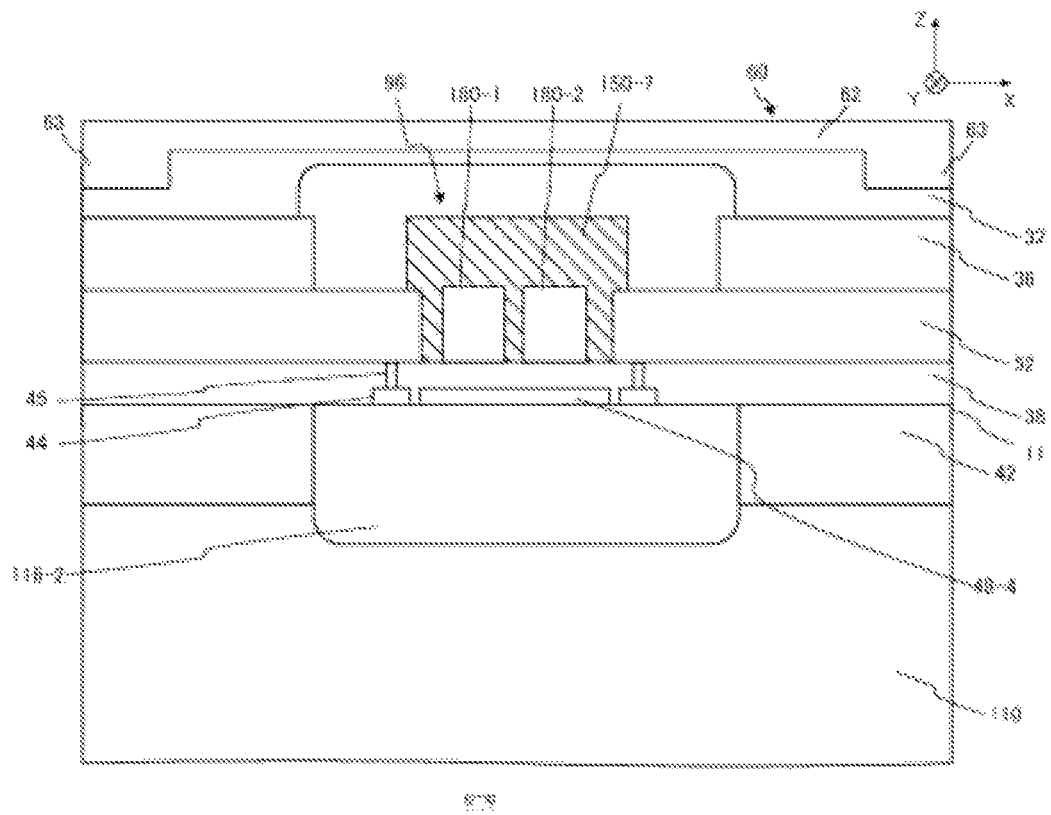
FIG. 16 illustrates one example of the semiconductor module 100 in a cross section e-e of FIG. 15.

FIG. 16 illustrates one example of the semiconductor module 100 in the cross section e-e in FIG. 15. The cross section e-e is a cross section on the XZ plane. In the cross section, the semiconductor module 100 includes a solder layer 32, a plated layer 36, a interlayer dielectric film 38, a connection portion 44, a gate runner 48-4, a metal electrode 52, a chip connection portion 62 of the lead frame 60, a semiconductor substrate 110 and a protective film 150-7. In the cross section, the lower surface of the semiconductor substrate 110 is omitted. In the cross section, the configurations of the solder layer 32 and the chip connection portion 62 of the lead frame 60 are different from those in the cross section of FIG. 14. The other configurations in FIG. 16 may be identical to those in FIG. 14.

Also this example, similar to FIG. 14, the chip connection portion 62 of the lead frame 60 is provided above the protective film 150-7. The chip connection portion 62 covers the protective film 150-7 above the protective film 150-7. Also, the semiconductor module 100 has a space 96 between the chip connection portion 62 and the protective film 150-7.

Also in this example, the chip connection portion 62 includes a plurality of protruding portions 63 protruding from the solder layer 32 side. Accordingly, the distance of the part between the protective film 150-7 and the chip connection portion 62 above the protective film 150-7 can be increased. Accordingly, it can be easy to ensure the space 96.

In FIG. 16, a solder layer 32 is provided between the chip connection portion 62 and the protective film 150-7. The semiconductor module 100 has a space 96 between the solder layer 32 and the protective film 150-7 above the protective film 150-7. Although the solder layer 32 flows above the protective film 150-7, with the protruding portion 63, the space 96 in this example is ensured to be wide, the generation of the triple point and the stress concentration due to the triple point can be prevented.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor module, comprising:
    a semiconductor chip including a semiconductor substrate and a metal electrode provided above the semiconductor substrate;
    a protective film provided above the metal electrode;
    a plated layer provided above the metal electrode, having at least a part being in a height identical to the protective film;
    a solder layer provided above the plated layer; and
    a lead frame provided above the solder layer,
    wherein the plated layer is provided in a range that is not in contact with the protective film and does not overlap with the protective film in a top view.

2. The semiconductor module of claim 1, wherein the solder layer is provided in a range not in contact with the protective film.

3. The semiconductor module of claim 1, wherein the solder layer is provided to have at least a part being in a height identical to the protective film.

4. The semiconductor module of claim 2, wherein the solder layer is provided to have at least a part being in a height identical to the protective film.

5. The semiconductor module of claim 1, wherein the protective film is provided in a location lower than the lead frame in a height direction.

6. The semiconductor module of claim 2, wherein the protective film is provided in a location lower than the lead frame in a height direction.

7. The semiconductor module of claim 1,
wherein the semiconductor chip further includes:
a temperature sensing diode provided above the semiconductor substrate; and
sense wiring connected to the temperature sensing diode,
wherein the protective film is configured to cover the temperature sensing diode and the sense wiring; and
wherein the protective film covering the temperature sensing diode or the sense wiring is away from the solder layer and the plated layer.

8. The semiconductor module of claim 2,
wherein the semiconductor chip further includes:
a temperature sensing diode provided above the semiconductor substrate; and
sense wiring connected to the temperature sensing diode,
wherein the protective film is configured to cover the temperature sensing diode and the sense wiring; and
wherein the protective film covering the temperature sensing diode or the sense wiring is away from the solder layer and the plated layer.

9. The semiconductor module of claim 7, wherein
the lead frame includes a chip connection portion connected to the semiconductor chip; and
the chip connection portion is configured not to overlap with the temperature sensing diode and the sense wiring in a top view.

10. The semiconductor module of claim 1, wherein
the lead frame includes a chip connection portion connected to the semiconductor chip;
the chip connection portion is configured to cover the protective film above the protective film; and
there is a space between the chip connection portion and the protective film.

11. The semiconductor module of claim 2, wherein
the lead frame includes a chip connection portion connected to the semiconductor chip;
the chip connection portion is configured to cover the protective film above the protective film; and
there is a space between the chip connection portion and the protective film.

12. The semiconductor module of claim 10, having a space between the solder layer and the protective film above the protective film.

13. The semiconductor module of claim 12, wherein the chip connection portion includes a plurality of protruding portions protruding from the solder layer side.

14. The semiconductor module of claim 1, wherein
the semiconductor chip further includes a metal gate runner provided above the semiconductor substrate; and
the protective film covering the metal gate runner is away from the solder layer and the plated layer.

15. The semiconductor module of claim 1, wherein a filler material with a smaller elastic modulus than the protective film is configured to fill between the plated layer and the protective film.

16. The semiconductor module of claim 1, wherein a filler material with a smaller difference of a linear expansion coefficient from the plated layer or the solder layer, when compared with the protective film, is configured to fill between the plated layer and the protective film.

17. The semiconductor module of claim 1, wherein a filler material with adhesiveness to the metal electrode higher than the protective film is configured to fill between the plated layer and the protective film.

18. The semiconductor module of claim 15, further comprising
sealing resin configured to seal the semiconductor chip and the lead frame,
wherein the filler material is a material different from the sealing resin.

19. The semiconductor module of claim 1, wherein the solder layer is provided between the plated layer and the protective film.

20. The semiconductor module of claim 19, wherein the solder layer is configured to cover a corner portion of the plated layer in contact with the solder layer.

21. A semiconductor module, comprising:
a semiconductor chip including a semiconductor substrate and a metal electrode provided above the semiconductor substrate;
a protective film provided above the metal electrode;
a plated layer provided on an upper surface of the metal electrode;
a solder layer provided above the plated layer; and
a lead frame provided above the solder layer,
wherein the plated layer is provided in a range not in contact with the protective film, and
the plated layer does not overlap with the protective film in a top view.

* * * * *